United States Patent

Nakayama et al.

[11] 4,278,318
[45] Jul. 14, 1981

[54] HOLOGRAPHIC RECONSTRUCTING APPARATUS

[75] Inventors: Yoshikazu Nakayama; Fumikazu Tateishi, both of Hirakata; Katsuyuki Fujito, Higashiosaka, all of Japan

[73] Assignee: Matsushita Electric Industrial Co., Ltd., Osaka, Japan

[21] Appl. No.: 970,439

[22] Filed: Dec. 18, 1978

[30] Foreign Application Priority Data

Dec. 19, 1977 [JP] Japan ............................. 52-153232
Sep. 14, 1978 [JP] Japan ............................. 53-113166

[51] Int. Cl.³ ............................................. G03H 1/30
[52] U.S. Cl. .................................................. 350/3.78
[58] Field of Search ............................. 356/399–401; 350/3.75, 3.78, 3.86

[56] References Cited

U.S. PATENT DOCUMENTS

| | | | |
|---|---|---|---|
| 3,560,072 | 2/1971 | Silverman et al. | 350/3.75 |
| 3,715,733 | 2/1973 | Feiner et al. | 350/3.78 |
| 3,911,410 | 10/1975 | Ohta et al. | 350/3.78 |

Primary Examiner—John K. Corbin
Assistant Examiner—Bruce Y. Arnold
Attorney, Agent, or Firm—Stevens, Davis, Miller & Mosher

[57] ABSTRACT

Holographic reconstructing apparatus capable of exchanging a hologram memory plate and having a large memory capacity, wherein the position of the memory plate relative to an irradiating laser beam can be accurately controlled. A beam irradiated from a laser source is deflected by a light deflector and is selectively directed to a selected hologram to be read or directed intermittently to a region for dividing the laser beam into a plurality of laser beams. The intensity of each divided laser beam is detected by a light detector, and the detection signal is fed back to control the working point of the light deflector such that the center of the laser beam irradiates the center of the luminous laser beam dividing region. The working point is held until the light deflector again directs the laser beam to the dividing region so that the laser beam radiates a selected hologram on the hologram plate accurately.

13 Claims, 15 Drawing Figures

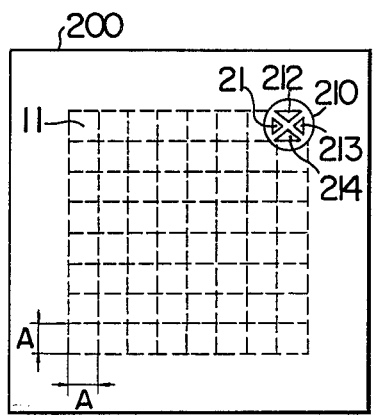
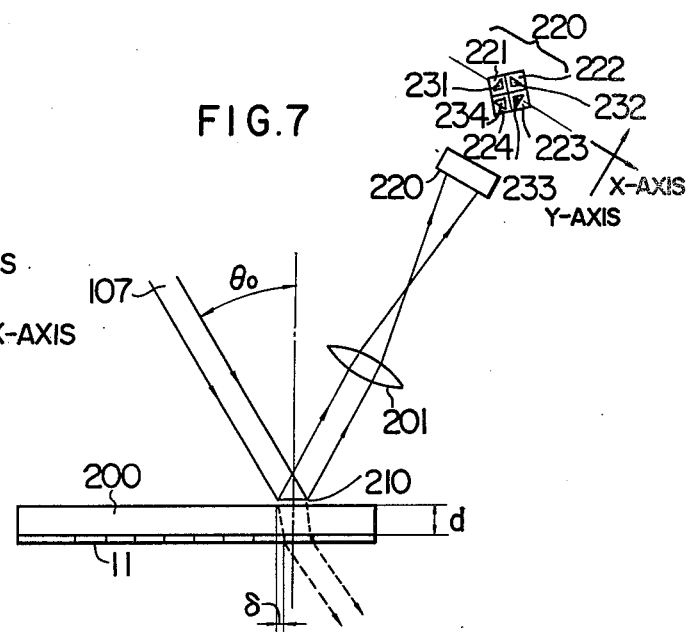
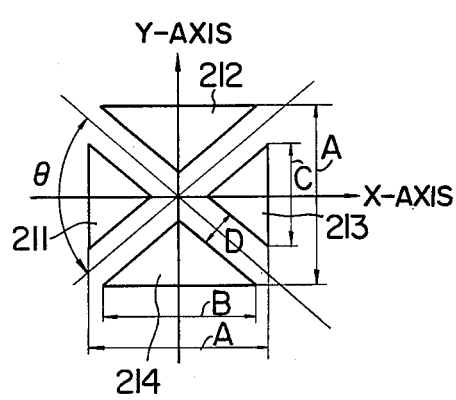
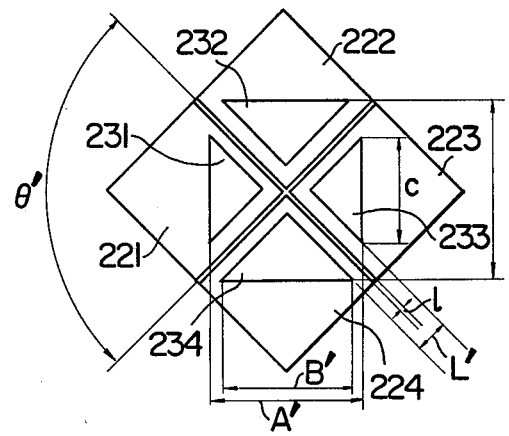
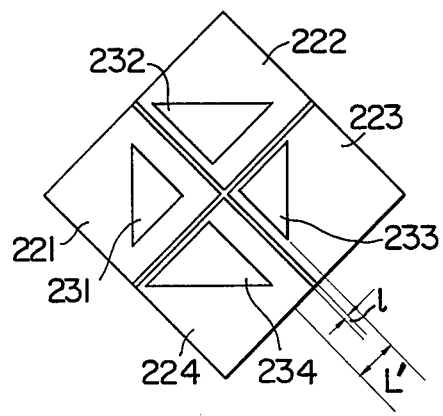

HOLOGRAPHIC RECONSTRUCTING APPARATUS

BACKGROUND OF THE INVENTION

This invention relates to a holographic reconstructing apparatus, and more particularly to a holographic reconstructing apparatus capable of exchanging hologram plates and having a large memory capacity.

Conventionally in a holographic reconstructing apparatus using a hologram, even if the position of a laser beam deviates more or less from the position of a hologram memory plate, due to a redundancy of the hologram, all the required information can still be reproduced. Therefore, a small addressing inaccuracy has been allowed for a laser beam which irradiates, via a light deflector, a hologram memory plate. However, in order to store a large number of pieces information in a high density in one sheet of hologram plate, it has become necessary to use a Fourier transform type hologram, and to make the hologram small sized and in a high density. As a result, it has become necessary to make a drift of the many hologram address positions of a light beam small which drift arises from external noise in the reconstructing means such as the variation of the laser beam in the exit angle of the laser source.

There is a limit in recording a large quantity of information on a sheet of hologram plate, and it is apparent that it is possible to make recording and reconstruction of a large quantity of information by exchanging a plurality of hologram memory plates and reconstructing. However, exchange of the plates requires a high precision in the spatial position of the plate itself as well as in the relative position between a hologram memory plate and each recorded hologram and a certain type of servo mechanism is required. However, it has been difficult to attain a high speed control of the position of the hologram plate since the mass of the hologram plate itself is large.

SUMMARY OF THE INVENTION

An object of this invention is to provide a holographic reconstructing apparatus for storing a large quantity of information with a high density.

Another object of this invention is to provide a holographic reconstructing apparatus which corrects a drift of the address position of the laser beam irradiating the hologram, which drift arises from a change or fluctuation of the laser beam in the exit angle of the laser source and a fluctuation of the deflection angle due to the heat of the light deflector, etc.

A further object of this invention is to provide a holographic reconstructing apparatus which corrects the relative error in position between the laser beam to be irradiated and the hologram which error occurs from an error in setting the position of the hologram memory plate when the hologram memory plate is exchanged.

An apparatus according to this invention comprises, as its construction elements, a laser source, a memory plate including a Fourier transform type hologram with page construction, an optical system including a light deflector for directing a laser beam to a hologram and to a luminous laser beam dividing region, a Fourier transform lens for Fourier transforming the flux of light diffracted by the hologram, an information detecting means for detecting a reconstructed image, a light detector including a plurality of light detecting elements for detecting the intensity of flux of light divided by the luminous flux dividing region on the hologram memory plate, and a feedback circuit for feeding back the output of the light detector back to the light deflector.

The luminous flux dividing region on the hologram memory plate is irradiated intermittently with the laser beam, and the intensity of the divided light flux is detected by the light detector respectively. Each of the detected signals are compared with each other and signals corresponding to differences of the detected signals are fed back to the light deflector. The working point of the light deflector is set by the feedback signal in such a way that the center of the laser beam may be positioned on the center of the luminous flux dividing region. Centering the laser beam relative to the flux dividing region also properly positions the beam relative to an irradiated hologram as will be seen below. The working or operating point is held until the light detector receives next a flux of the laser beam. Thus, the laser beam irradiates the hologram accurately.

In this way, a holographic reconstructing apparatus having a function of correcting a drift in address position of the laser beam to irradiate a hologram which drift occurs from external noise such as a fluctuation in the exit angle of the beam from the laser beam source, and also correcting a relative position difference between the laser beam to be irradiated and the hologram which difference occurs from an error in setting of the hologram memory plate at the time of exchange of hologram memory plates, can be obtained.

BRIEF DESCRIPTION OF THE DRAWINGS

FIG. 6 shows a detailed view of a hologram memory plate in FIG. 5.

FIG. 7 shows an arrangement of a hologram memory plate and a light detector in FIG. 5.

FIG. 8 shows the construction of the light dividing means in FIG. 6.

FIGS. 9 and 10 show a relation in position between an image of the light dividing means and the light detector.

DESCRIPTION OF PREFERRED EMBODIMENTS

Embodiments of this invention will be explained hereinafter in conjunction with the accompanying drawings.

Figure 1:
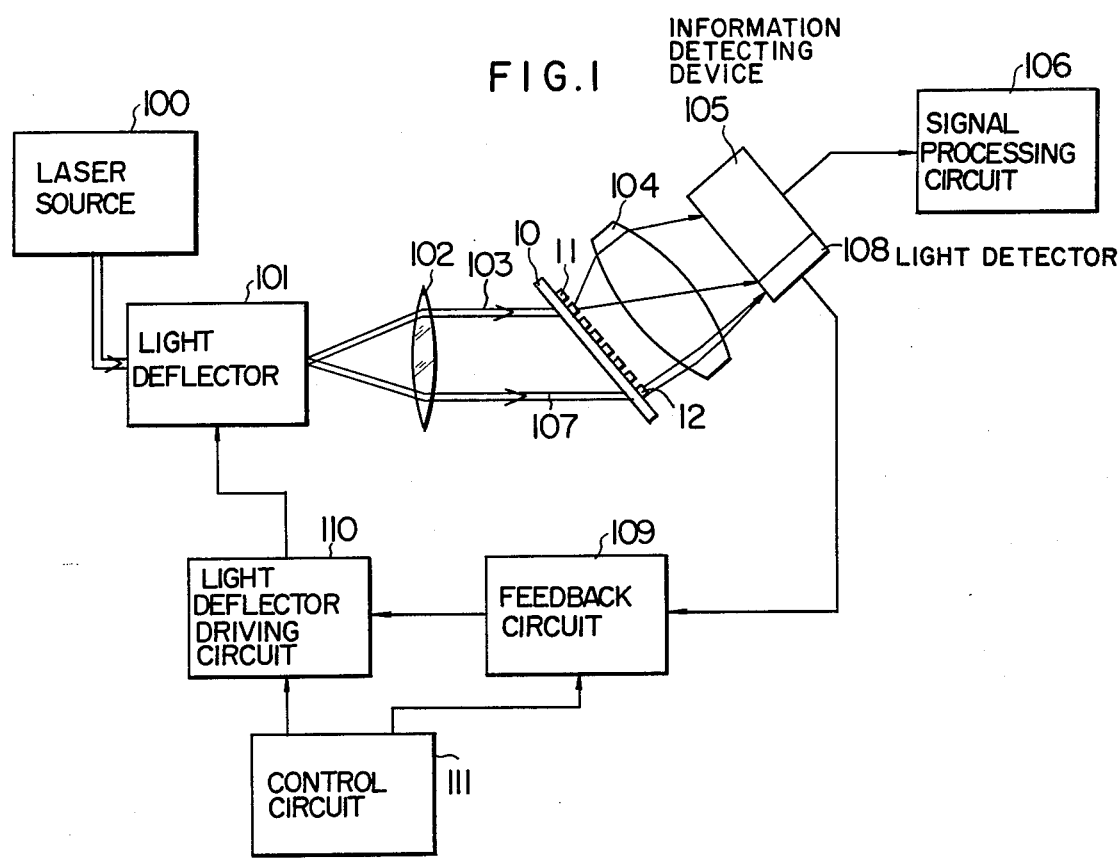
FIG. 1 shows a holographic reconstructing apparatus according to the first embodiment of this invention.
Figure 2:
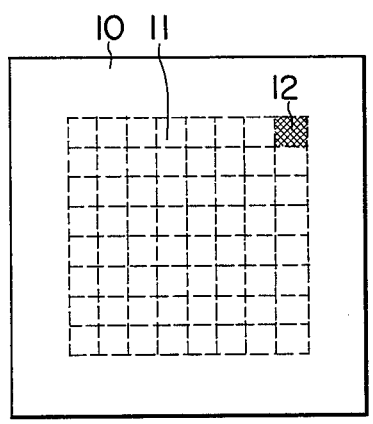
FIG. 2 shows a detailed view of a hologram memory plate in FIG. 1.

FIG. 1 shows an example of the construction of a holographic reconstructing apparatus according to the first embodiment of this invention. A hologram memory plate used here is shown in FIG. 2. The hologram plate 10 comprises a Fourier transform type hologram group 11 on which information is recorded and a hologram 12 which divides a laser beam. The laser beam from a laser beam source 100 enters into a light deflector 101. The deflected laser beam is collimated by a collimating lens 102, passes through an optical path 103 and irradiates a selected hologram on the memory plate 10. The light beam diffracted by the hologram passes through the Fourier transform lens for reconstruction 104 and is focussed on an information detecting means 105. Here, the optical image is converted into an electric signal. The signal is applied to a signal processing circuit 106 by means of which information is derived.

Figure 3:
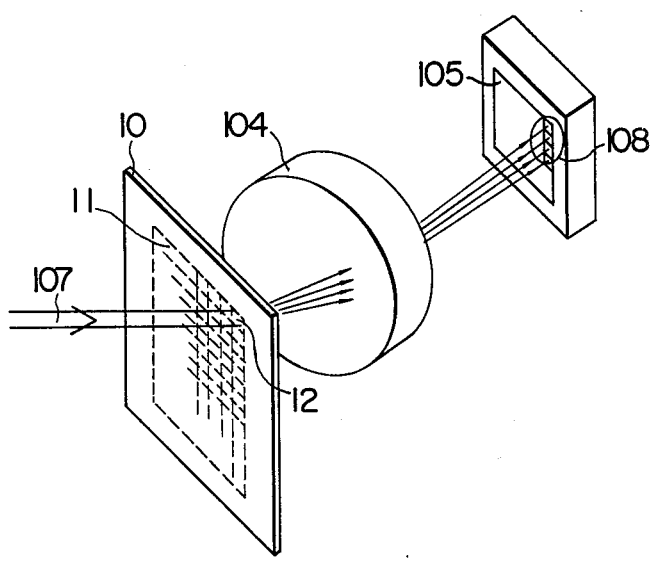
FIG. 3 shows an arrangement of the hologram memory plate and a light detector.

On the other hand the laser beam is intermittently deflected from a position of irradiating a selected hologram; by a light deflector 101 so that the laser beam passes through an optical path 107 and irradiates the hologram 12 which divides the laser beam. Four laser beams made by division by the hologram are focussed on the light detector 108 including four detecting elements through a Fourier transform lens 104 as shown in FIG. 3.

Figure 4:
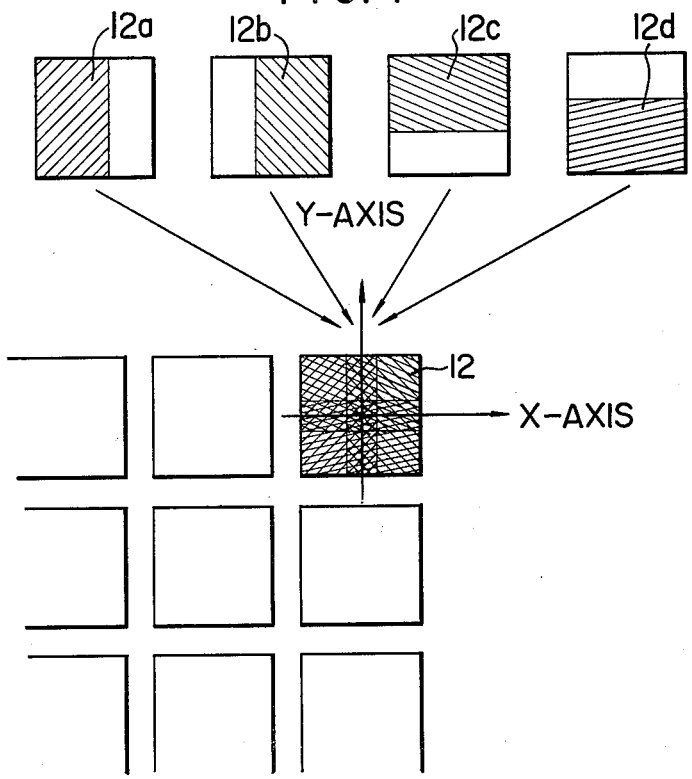
FIG. 4 shows a construction of the light dividing means shown in FIG. 2.

The hologram 12 comprises Fourier transform type hologram components 12a, 12b, 12c, and 12d of a point object which correspond to four light detecting elements of the light detector 108, as shown in FIG. 4. The hologram components 12a, 12b, 12c, and 12d are formed in a shaded region of a hologram 12. The regions of hologram components 12a, 12b and 12c, 12d are linearly symmetric with respect to Y and X axes respectively. The hologram 12 is formed either by superimposing these four hologram components coherently or by recording them in multiple incoherently. When the hologram 12 is irradiated by a Gaussian laser beam with a diameter of the same order as that of the hologram 12, the partial flux of the laser beam in the right, left, upper and lower regions of the cross-section of the laser beam are diffracted by the hologram components 12a, 12b, 12c, and 12d respectively. In this way the irradiating laser beam is divided by the hologram 12. Since the hologram 12 is a Fourier transform type hologram, the parallel displacement or translation of the memory plate or parallel displacement of the laser beam does not exert any influence upon the position of the reconstructed image. Therefore, a relative deviation in the X axis and Y axis directions between the hologram 12 and the position of the light beam can be detected by utilizing the hologram components 12a, 12b, 12c and 12d. For example, if the irradiating position of the laser beam shifts in the X axis direction with respect to the hologram 12, the intensity of the laser beam diffracted by the hologram component 12b becomes larger than that of the light beam diffracted by the hologram component 12a, and from this fact a deviation in X axis direction can be detected. It should be noted here that the intensities of light diffracted by the hologram components 12c and 12d are equal to each other.

In FIG. 1, when the laser beam diffracted by the hologram 12 is projected into the light detector 108, the feedback circuit 109 operates and a feedback signal is applied to the light deflector 101 through the light deflector driving circuit 110 so that the outputs of light detection elements corresponding to the hologram components 12a and 12b, and 12c and 12d, may become equal to each other. The feedback circuit 109 includes an amplifier which takes differences between the outputs of two pairs of detecting elements which detect any deviation of laser beam in X axis and Y axis directions, amplifies the difference signals and supplies offset signals of X axis and Y axis directions to the light deflector driving circuit 110. The feedback circuit 109 includes also a hold circuit which holds the working point of the light deflector 101 after the feedback loop reaches a stable state. The laser beam is deflected such that the laser beam irradiates a selected hologram of the hologram group 11 with the above working point as a reference until the next irradiation of the hologram 12. A control circuit 111 is a circuit for controlling the above operation.

In FIG. 1, since the reconstruction from the hologram memory plate 10 is performed as is well known, by a light beam conjugate to a reference light beam used for recording the hologram, the memory plate is arranged such that the side of the memory plate where a photo-sensitive material is provided or the side where the hologram group 11 is provided faces the Fourier transform lens 104.

In this way, a drift in address position of the laser beam irradiating the hologram, which drift occurs from a fluctuation in the exit angle of the laser beam source and a fluctuation of the deflection angle of the light deflector due to the heating of the light deflector; and a relative deviation between the irradiated laser beam and the hologram due to an error in setting of the hologram memory plate can be corrected.

Figure 5:
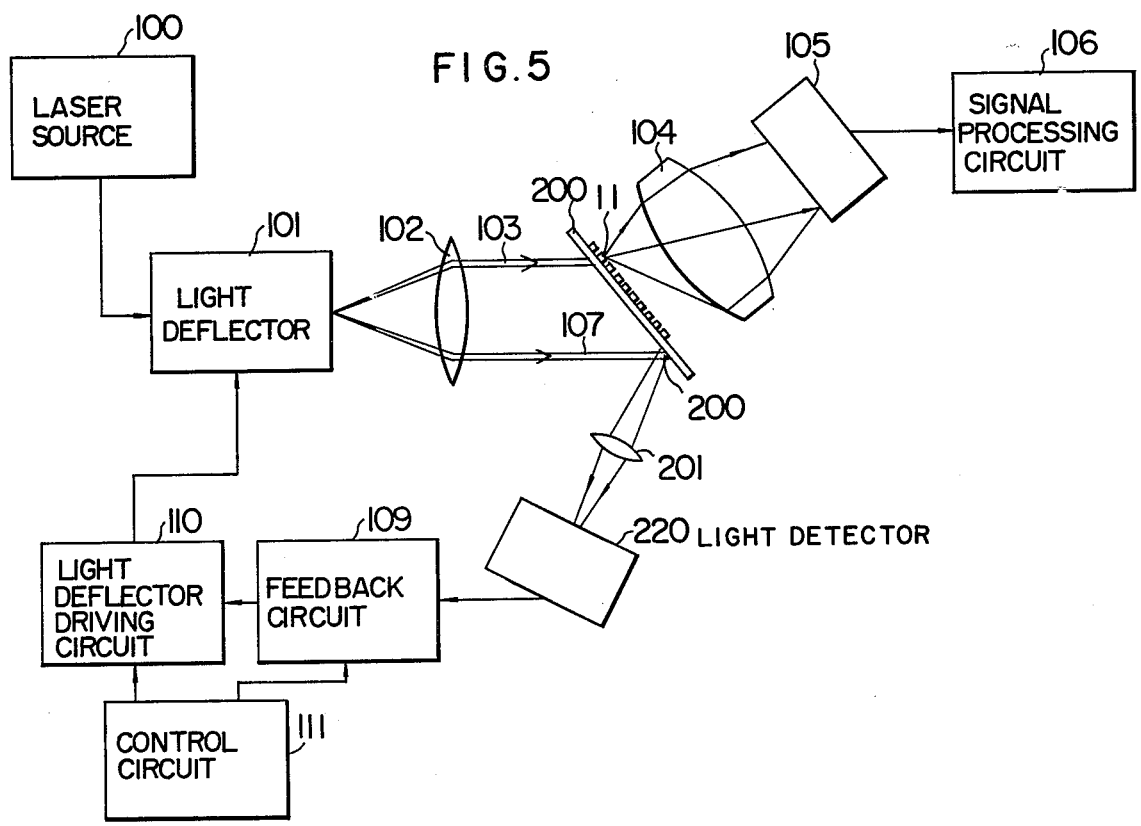
FIG. 5 shows a holographic reconstructing apparatus according to the second embodiment of this invention.

An example of the construction of a holographic reconstructing apparatus of the second embodiment is shown in FIG. 5. A hologram memory plate 200 used here is shown in FIG. 6. FIG. 7 shows a system in which the laser beam reflected from a reflection pattern 210 which divides the laser beam is received by a light detector 220. The second embodiment differs from the first embodiment in the following points. (1) The luminous laser beam dividing means formed on the memory plate 200 is a reflection pattern 210 including four mirrors 211, 212, 213 and 214. (2) The image is focussed on a light detector 220 by a focus lens 201. (3) Four light detection elements 221, 222, 223 and 224 are provided in the positions corresponding to the images of four mirrors 211, 212, 213 and 214.

The difference of outputs of the detecting elements 221 and 223, and that of outputs of the detecting elements 222 and 224 correspond respectively to the X axis and Y axis components of the relative deviation in position between the reflected pattern 210 and the irradiating laser beam. The system for detecting these difference outputs and controlling the working point of the light deflector 101 is the same as that of the first embodiment.

The reflection pattern 210 is provided on the surface which is opposite to the surface where the hologram is formed in order to avoid external noise such as reflection by the substrate surface of the memory plate 200 etc. The reflection pattern is constructed with four mirrors 211, 212, 213 and 214, as shown in FIG. 8. The size of the reflection pattern is the same as that of the hologram, i.e. A×A, and the position of the reflection pattern is at the right upper corner of the hologram group 11 arranged in a matrix form and shifted leftwords by δ in X axis direction from the normal measure of the matrix, as shown in FIGS. 6 and 7. Here, δ denotes a relative deviation of the irradiated regions on the surface and opposite surface of the memory plate 200 on which the laser beam is irradiated from an optical path 107 to irradiate the above-mentioned measure. Assuming that the incident angle formed by the optical path 107 and the memory plate 200 is $\theta_o$, the thickness of the memory plate is d and the refractive index is n, the following equation is formed.

$$\delta = d \frac{\sin \theta_o}{\sqrt{n^2 - \sin^2 \theta_o}}.$$

The light detector 220 is mounted perpendicularly to the normal line of the wave front of the light reflected from the reflection pattern 210, as shown in FIG. 7. Four detection elements 221, 222, 223 and 224 constituting the light detector 220 have a rectangular form, as a detection element of a rectangular form is easily available, and are so arranged that the boundary between each detection element (width l) has an X shape intersecting with an angle of $\pi/2$, as shown in FIG. 9. Thus, the reflection pattern 210 is arranged in such a way that the images 231, 232, 233 and 234 of four mirrors 211, 212, 213, and 214 are in the positions corresponding to the detecting elements 221, 222, 223 and 224 respectively, as shown in FIG. 9. The spacing L' between each image is made sufficiently larger than l. The intersection angle $\theta'$ of an X formed by these spaces is $\pi/2$. The size of the images in the X axis direction is different from the size of the images in the Y axis direction, however, the images each forming pairs 231 and 233, and 232 and 234, are linearly symmetric. The shape of the reflection pattern 210 for obtaining these images is shown in FIG. 8. In order to use the energy of the laser beam irradiated on the reflection pattern 210, the mirrors 211, 212, 213, and 214 are formed to be of triangular shape. The triangle mirrors 211 and 213 are linearly symmetric with respect to the Y axis while the triangle mirrors 212 and 214 are linearly symmetric with respect to the X axis. The angle $\theta$ is given by $$\theta = \pi - 2 \tan^{-1}(1/\cos\theta_o),$$

since $\theta'$ on the images plane is $\pi/2$. The lengths A and B in the X axis direction of the pattern and the spacing L between each mirror are given, on the light detector 220

$$A' = A \cos \theta_o,$$

$$B' = B \cos \theta_o,$$

$$L' = \frac{L}{\sqrt{2} \sin \left[ \tan^{-1}\left(\frac{1}{\cos \theta_o}\right) \right]}$$

assuming that the multiplication factor in forming an image is assumed to be 1.

In an arrangement such as this, if a feedback is applied so that the outputs of the detection elements 221 and 223, and 222 and 224 may become to be equal to each other, the center of the laser beam is made to coincide with the center of the reflection pattern 210. Even if the set position of the memory plate 200 shifts slightly, the center of the laser beam can be made to coincide with the center of the reflection pattern 210 so long as the boundary region (width l) between each of the elements 221, 222, 223 and 224 of the light detector 220 fall within the space L' formed by the images 231, 232, 233 and 234 of the reflection pattern 210, as shown in FIG. 10.

Figure 11:
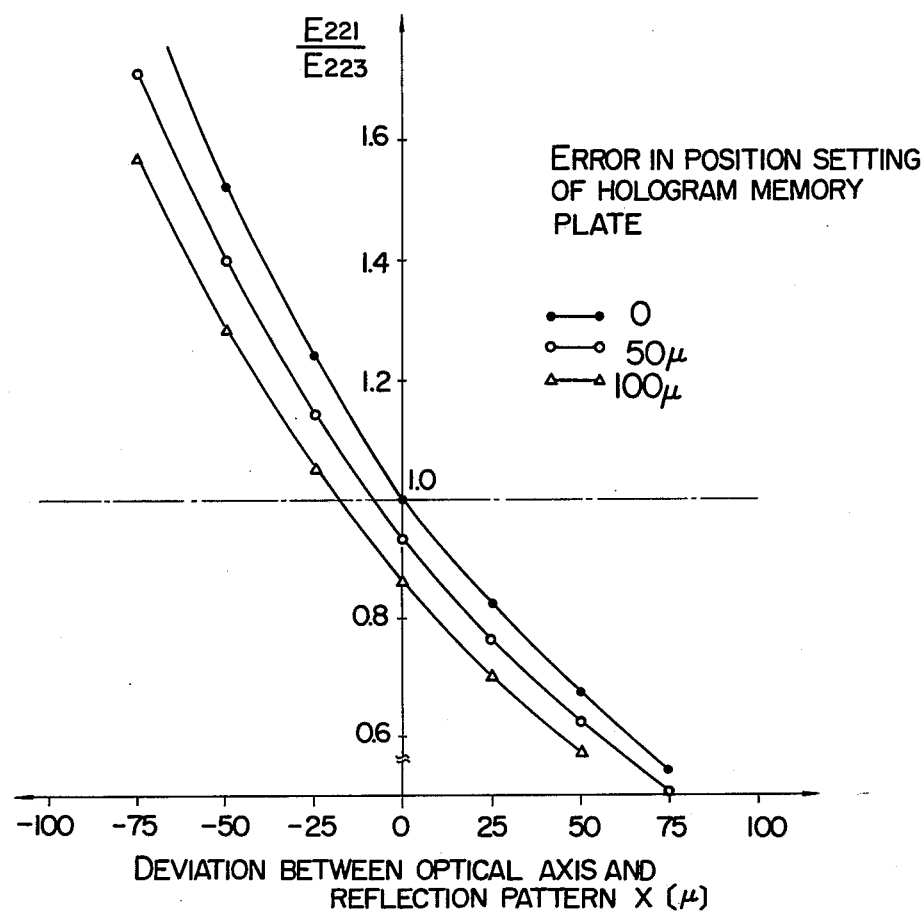
FIG. 11 shows the characteristic of the light dividing means in FIG. 8.

In the case where the substrate of the memory plate 200 is formed by glass and four mirrors of the reflection pattern 210 are formed by an aluminum evaporated film, a satisfactory performance can be obtained even if the gap between the mirrors is not especially made reflectionless. FIG. 11 shows the characteristic in this case. In FIG. 11 the ordinate shows the ratio of the output $E_{221}$ of the detecting element 221 to the output $E_{223}$ of the detecting element 223 while the abcissa shows a deviation x in X axis direction between the center of the reflection pattern 210 and the center of the laser beam projected to a surface perpendicular to the normal of the wave front of the flux of light. As parameters a setting position error of the hologram memory plate is selected to be 0 [μ], 50 [μ] and 100 [μ]. Here, the laser beam irradiated on the hologram is assumed to be a Gaussian beam of 1.28 mm ϕ, and it is assumed that $\theta = 32°$, A=1.4 mm, B=1.15 mm, L=0.32 mm, $\theta = 80.6°$, l=0.1 mm and the multiplication factor in image forming is 1.2.

Although, in the above, the four reflection regions constituting the reflection pattern 210 are formed to be triangular shape in view of effective use of the laser beam, the regions may be made to be of any arbitrary shape.

In this way, a drift in the address position of the laser beam irradiated on the hologram which drift occurs from the fluctuation in the exit angle of the laser source and the fluctuation of the deflection angle of the light deflector due to the heat of the light deflection etc. can be corrected. The relative deviation between the irradiated laser beam and the hologram due to a setting error of the hologram memory plate can also be corrected.

Figure 12:
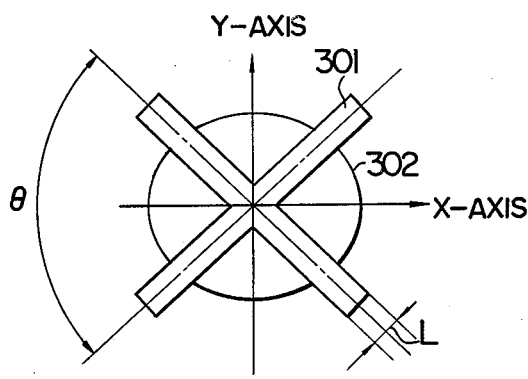
FIG. 12 shows another embodiment of a light dividing means.
Figure 14:
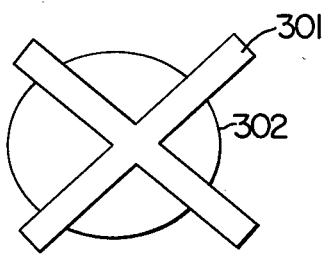
FIG. 14 shows a deviation in position between the image of the light dividing means and the irradiated beam.
Figure 13:
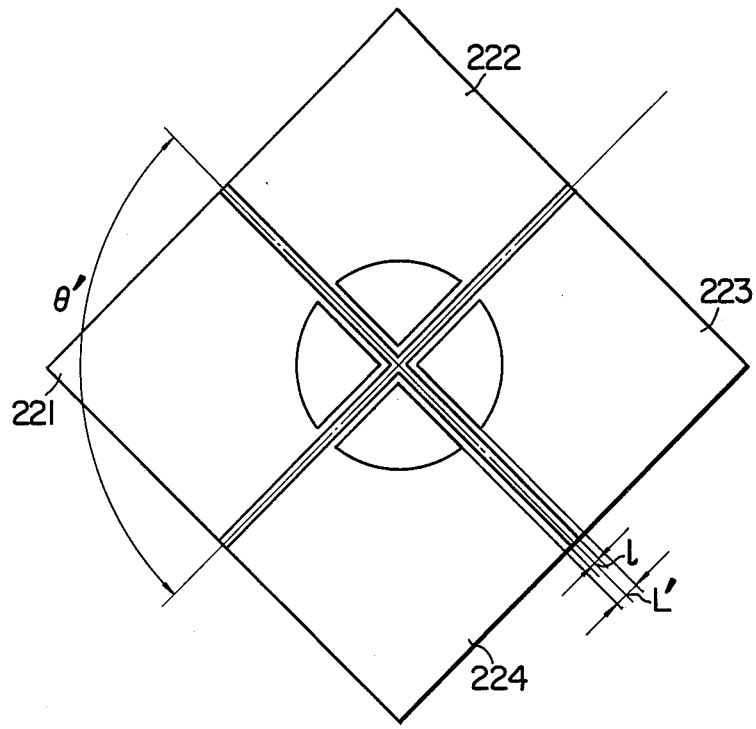
FIG. 13 shows a relation in position between an image of the light dividing means in FIG. 12 and the light detector.

Next, the third embodiment will be explained, in which an opaque X shape pattern is mounted on the hologram memory plate as a means for dividing the laser beam. FIG. 12 shows an opaque X shape pattern 301 with a width L and an intersection angle $\theta$, and the pattern 302 of the irradiating laser beam. Since the incident angle of the flux of light is $\theta_o$, the laser beam has an elliptic shape and the center of the beam coincides with the center of the opaque X shape pattern. As a holographic reconstructing system, the focussing lens 201 and the light detector 220 in FIG. 5 are positioned so as to receive the laser beam passed through the optical path 107 and the memory plate 200. As shown in FIG. 12, when the opaque X shape pattern 301 is irradiated by the laser beam such as the irradiation pattern 302, the transmitting light beam outside the X shape pattern 301 is focussed on the light detector 220 by the focussing lens 201. FIG. 13 shows this state, where $\theta'$, l, and L' have the same meanings as those of the second embodiment (FIG. 9). Namely, relations l<L' and $\theta' = \pi/2$ are held. The relations of L and $\theta$ of the X shape pattern 301 with $\theta_o$ and L' are the same as those of the second embodiment. FIG. 14 shows a case where the center of the opaque X shape pattern 301 is deviated from the center of the pattern of the irradiated laser beam 302. In this case, the output of the detection element 221 in the light detector 220 becomes larger than that of the detecting element 223 and the deviation between the center of the opaque X shape pattern 301 and the center of the irradiating laser beam is detected. If a feedback is applied so that the outputs of the detection elements 221 and 223 and the outputs of the detection elements 222 and 224 become equal to each other, the center of the laser beam can always be made to coincide with the center of the opaque X shape pattern 301. This embodiment brings fourth the same effect of correcting a small fluctuation in the set position which is obtained by the memory plate as that of the second embodiment.

Figure 15:
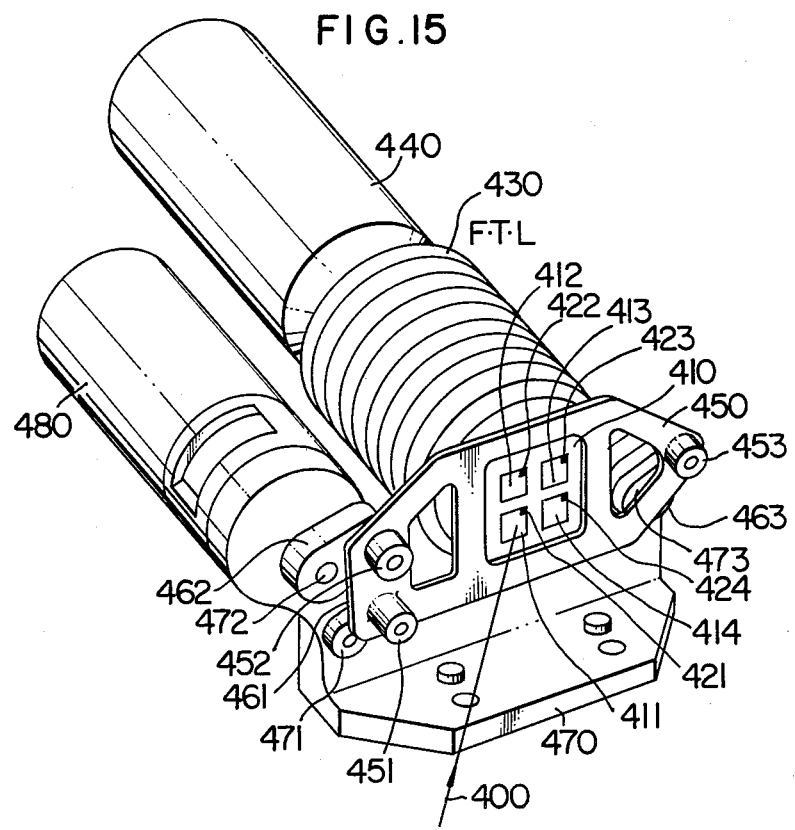
FIG. 15 shows a construction for exchanging hologram memory plates according to an embodiment of this invention.

FIG. 15 shows a means for moving a hologram memory plate comprising four hologram groups so that a fixed one of the hologram plate groups may be positioned at a certain fixed position. The hologram memory plate 410 has luminous flux dividing regions 421, 422, 423 and 424 which correspond to four hologram groups 411, 412, 413 and 414 respectively. In the figure, the hologram group 411 exists in an effective region of a Fourier transform lens 430 and the laser beam irradiates one hologram in the hologram group 411. The laser beam diffracted by the hologram is Fourier transformed by the Fourier transform lens 430 and is applied to an image tube 440.

The hologram memory plate 410 is mounted on a support plate 450. The support plate 450 is supported at the supporting points 451, 452 and 453, and these points are coupled to three supporting points 471, 472, and 473 of a base 470 by arms 461, 462 and 463 respectively. The supporting points 451, 452, 453, 471 and 473 are freely rotatable. The supporting point 472 is coupled to a shaft of a pulse motor 480. The support plate 450 and the arms 461, 462, and 463 are made to perform linked motion by means of a rotation of the pulse motor 480. In this manner, the hologram groups 412, 413, and 414 outside the effective region of the Fourier transform lens 430 are made to move into the effective region successively. When a fixed hologram group is exchanged, the laser beam irradiates first the luminous laser beam dividing region, and by detecting the divided laser beams the working point of the light deflector is set so that the laser beam may be applied to the center of the luminous laser beam dividing region. With this working point as a reference, the laser beam irradiates a selected hologram. Even if the hologram group is not exchanged, after the lapse of a certain fixed interval the laser beam irradiates the luminous laser beam dividing region and corrects the setting of the light deflector again, but until the working point is held at the previous state. The reconstruction from the hologram memory groups outside the region exceeding the effective radius of the Fourier transform lens can be also performed accurately. Especially since a four bar links mechanism is used, no rotation of the hologram group to the irradiating laser beam occurs in principle even if hologram groups are exchanged. Since the error in setting of the hologram group occurs without rotation, that is the parallel displacement or translation error can be corrected sufficiently, as described above, the irradiating light beam can be made to follow a fixed hologram accurately.

As described above, according to this invention, it is possible to realize a holographic reconstructing system for storing a large quantity of information with a high density, having a function of correcting a deviation of address position of the laser beam irradiated on the hologram which deviation occurs from a fluctuation in exit angle of laser source and the transformation by heat of the optical device which leads the laser beam to the hologram, and also correcting a position setting error of the memory plate occurring when exchanging the hologram memory plates as well as the position error between the hologram and the irradiating laser beam immediately without controlling the position of the memory plate. Especially, by using the link mechanism having a characteristic that the hologram memory plate does not rotate with respect to the irradiating laser beam during exchange of holograms, the reliability of the holographic reconstructing system is improved.

What is claimed is:

1. A holographic reconstructing apparatus comprising
   (a) a laser beam source,
   (b) a hologram memory plate containing at least one hologram group, each group including a number of holograms,
   (c) means for dividing a laser beam into a plurality of laser beams provided near said hologram group,
   (c) an optical means including a light deflector normally directing said laser beam to a selected hologram of said group and intermittently directing said laser beam to said dividing means,
   (e) means for intermittently controlling said light deflector to temporarily cause said light beam to be directed to said dividing means instead of said selected hologram,
   (f) a light detecting means including a plurality of light detecting elements for respectively receiving the laser beams divided by said dividing means,
   (g) means responsive to the output of said light detecting means for controlling said light deflector to correct the position of said laser beam to a predetermined desired position relative to said dividing means, whereby the light flux from said laser beam is accurately directed to a selected hologram when a selected hologram is irradiated, and
   (h) means for detecting the information from a selected irradiated hologram.

2. A holographic reconstructing apparatus according to claim 1, further comprising a plurality of hologram groups on said memory plate, each of said groups having a respective dividing means.

3. A holographic reconstructing apparatus according to claim 2, further comprising means for moving said memory plate such that a selected one of said hologram groups is placed at a predetermined reading position.

4. A holographic reconstructing apparatus according to claim 3, wherein said hologram groups on said memory plate are arranged so as to be divided by two orthogonally intersecting axes and said memory plate is displaced in a plane containing said two axes so that any one of said hologram groups is exchanged to be placed at said predetermined position.

5. A holographic reconstructing apparatus according to claim 1, wherein said dividing means consists of four holograms provided on first and second orthogonally intersecting axes and formed in a single hologram region, said holograms having different information representing different points respectively, and being linearly symmetric with respect to said first and second axes, said laser beam being diffracted by said four holograms into four laser beams which are respectively detected by a light detecting means including four independent light detecting elements.

6. A holographic reconstructing apparatus according to claim 1, wherein said dividing means is composed of a pattern including intersecting linear nonreflective or opaque regions which are linearly symmetric with respect to orthogonally intersecting first and second axes and of reflective or transparent regions outside said linear nonreflective or opaque regions, and wherein the divided laser beams are received as an image by said light detecting means which includes four independent light detecting elements which are separated from each other by boundaries corresponding to said pattern.

7. A holographic reconstructing apparatus according to claim 6, wherein the width of the image of said intersecting linear regions of said pattern on said light detecting means is made larger than the width of the boundary between said four light beam detecting elements.

8. A holographic reconstructing apparatus according to claim 6 further comprising a means for focussing the image of said pattern on said light detecting means.

9. A holographic reconstructing apparatus according to claim 6, wherein said hologram memory is formed on a transparent dielectric substrate, and said Pattern comprises a nearly X-shaped bare face of said dielectric substrate, wherein said reflective or transparent regions comprise four triangular, metal-evaporated mirrors which are divided by said X-shaped bare face and are linearly symmetric with respect to said first and second axes.

10. A holographic reconstructing apparatus comprising
   (a) a laser beam source,
   (b) a hologram memory plate having a plurality of hologram groups each including a number of holograms,
   (c) a luminous laser beam dividing means provided near said hologram groups, and including four independent reflection regions, each of said reflection regions being provided on two axes which pass through the center of the laser beam dividing means and orthogonally intersect one another, two of said reflection regions being linearly symmetric with respect to one of said axes and the other two of said reflection regions being linearly symmetric with the other of said two axes,
   (d) means for placing any one of said hologram groups in a predetermined hologram reading position,
   (e) an optical means including a light deflector for normally directing said laser beam to a selected hologram of said hologram groups and intermittently directing said laser beam to said dividing means,
   (f) means for intermittently controlling said light deflector to temporarily cause said light beam to be directed to said dividing means instead of said selected hologram,
   (g) a light detecting means including four light detecting elements for respectively receiving laser beams divided by said dividing means,
   (h) a focussing means for focussing said divided laser beams from said dividing means on said light detecting means,
   (i) means responsive to the output of said light detecting means for controlling the working point of said light deflector to correct the position of said laser beam such that the laser beam irradiates a predetermined position on said dividing means, whereby the flux of light from said laser beam is accurately directed to a selected hologram when a selected hologram is irradiated,
   (j) a means for holding the state of said controlled working point until said laser beam is again directed to said dividing means, and
   (k) means for detecting the information from a selected hologram irradiated by said laser beam.

11. A holographic reconstructing apparatus according to claim 10, wherein said hologram memory plate is formed as a transparent dielectric substrate having a hologram carrying surface, said dividing means is formed on the surface which is opposite to the hologram carrying surface of said memory plage, and said hologram memory plate is irradiated by the laser beam from the back side to reproduce information from a selected hologram.

12. A holographic reconstructing apparatus according to claim 10, wherein the shape of each of said four independent reflection regions, forming said dividing means, is triangular.

13. A holographic reconstructing apparatus according to claim 10, wherein the width of the image of the boundary regions formed by said four reflection regions on said light detecting means is larger than the width of the boundary between said four light detecting elements.

* * * * *